United States Patent
Chen

(10) Patent No.: US 9,041,849 B2
(45) Date of Patent: May 26, 2015

(54) IMAGE SENSOR MODULE AND CAMERA MODULE USING SAME

(71) Applicant: Hon Hai Precision Industry Co., Ltd., New Taipei (TW)

(72) Inventor: Shin-Wen Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 203 days.

(21) Appl. No.: 13/727,603

(22) Filed: Dec. 27, 2012

(65) Prior Publication Data

US 2014/0139710 A1    May 22, 2014

(30) Foreign Application Priority Data

Nov. 19, 2012 (TW) .............................. 101143165 A

(51) Int. Cl.
*H04N 5/225* (2006.01)
*H01L 27/146* (2006.01)

(52) U.S. Cl.
CPC ........... *H04N 5/2254* (2013.01); *H04N 5/2257* (2013.01); *H01L 27/14625* (2013.01)

(58) Field of Classification Search
None
See application file for complete search history.

(56) References Cited

U.S. PATENT DOCUMENTS

| 6,147,389 | A * | 11/2000 | Stern et al. ..................... 257/434 |
| 7,375,757 | B1 * | 5/2008 | Hoshino et al. ............... 348/340 |
| 2007/0122146 | A1 * | 5/2007 | Ryu .............................. 396/529 |
| 2007/0146534 | A1 * | 6/2007 | Kim et al. ..................... 348/340 |
| 2007/0217786 | A1 * | 9/2007 | Cho et al. ...................... 396/542 |
| 2007/0253697 | A1 * | 11/2007 | Kim et al. ..................... 396/275 |
| 2010/0045846 | A1 * | 2/2010 | Nishizawa et al. ........... 348/340 |

* cited by examiner

*Primary Examiner* — Justin P Misleh
(74) *Attorney, Agent, or Firm* — Novak Druce Connolly Bove + Quigg LLP

(57) ABSTRACT

An image sensor module includes a substrate, an image sensor, and a connecting plate. The substrate includes a supporting portion and an extending portion extending from one side of the supporting portion. The supporting portion includes an upper surface and a lower surface opposite to the upper surface. The supporting portion defines a through hole penetrating the upper surface and the lower surface and a receiving recess communicating the through hole on the lower surface. The thickness of the extending portion is less than the thickness of the supporting portion. The image sensor is received in the receiving recess and is electrically connected to the substrate. The connecting plate is electrically connected to the extending portion, the thickness of the connecting plate is less than or equal to the thickness difference between the extending portion and the supporting portion.

12 Claims, 4 Drawing Sheets

IMAGE SENSOR MODULE AND CAMERA MODULE USING SAME

BACKGROUND

1.1 Technical Field

The present disclosure relates to image sensor modules, and particularly, to an image sensor module with reduced height and a camera module including the image sensor module.

2.1 Description of Related Art

Camera modules generally include an image sensor module and a lens module positioned on the image sensor module. The image sensor module includes an image sensor, a substrate, a connecting plate, and a conductive film. The image sensor is positioned on the substrate. The substrate is electrically connected to the connecting plate by the conductive film. However, as the substrate and the conductive film are stacked on the connecting plate, the height of the camera module increases.

Therefore, it is desirable to provide an image sensor module and a camera module, which can overcome the limitations described.

DETAILED DESCRIPTION

Embodiments of the disclosure will be described with reference to the drawings.

Figure 1:
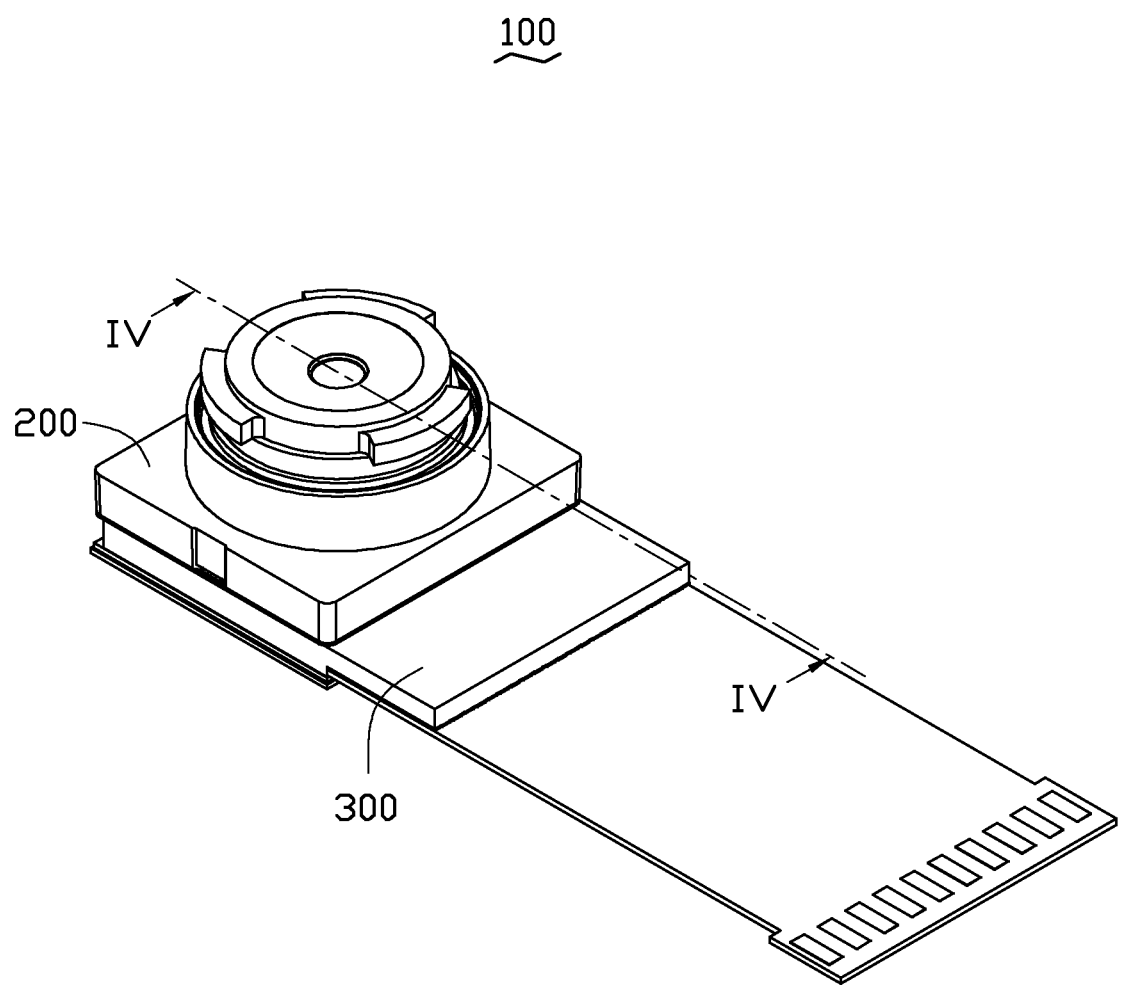
FIG. 1 is an isometric view of a camera module in accordance with an exemplary embodiment.
Figure 2:
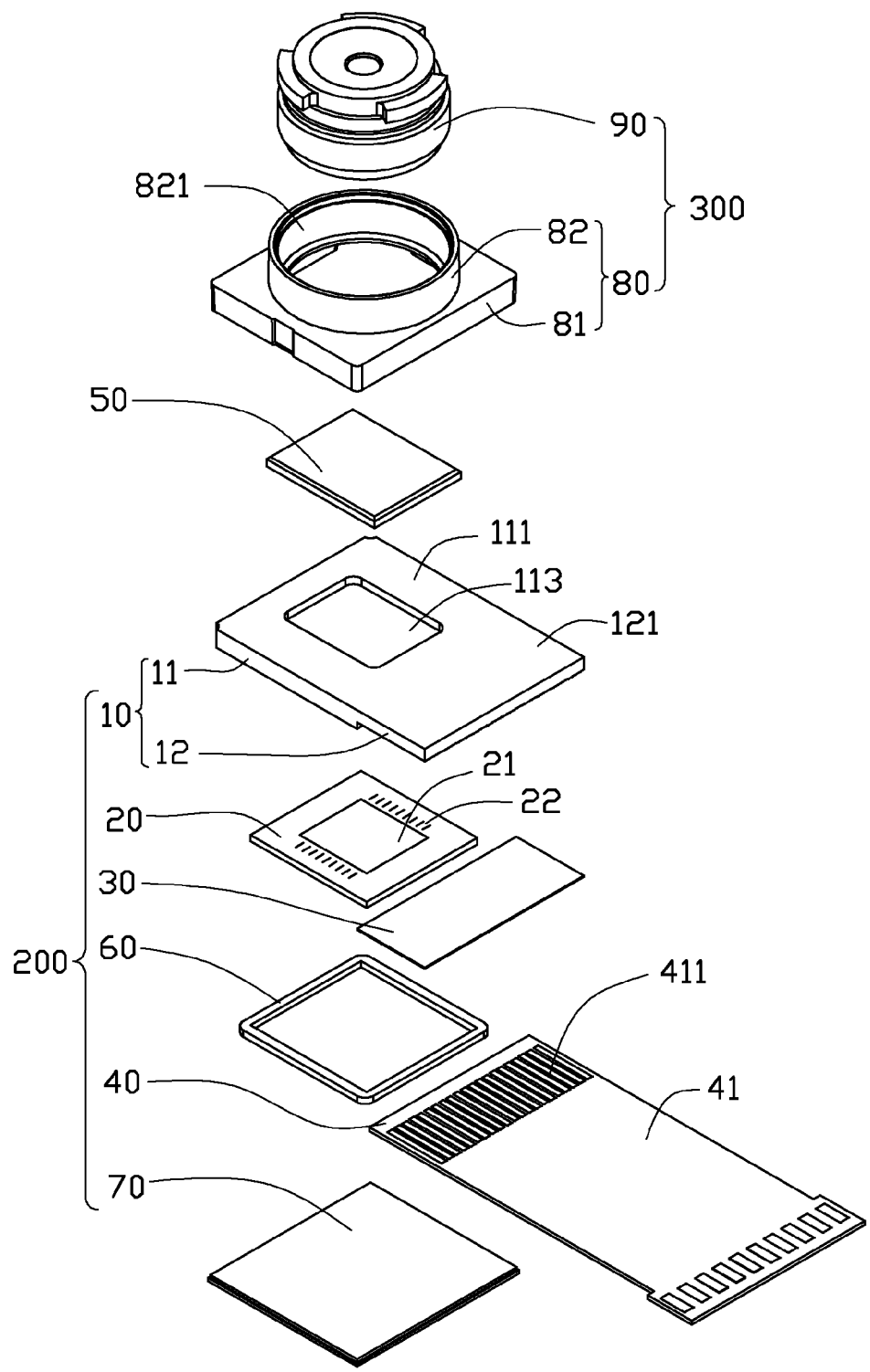
FIG. 2 is an isometric, exploded, and schematic view of the camera module of FIG. 1.
Figure 3:
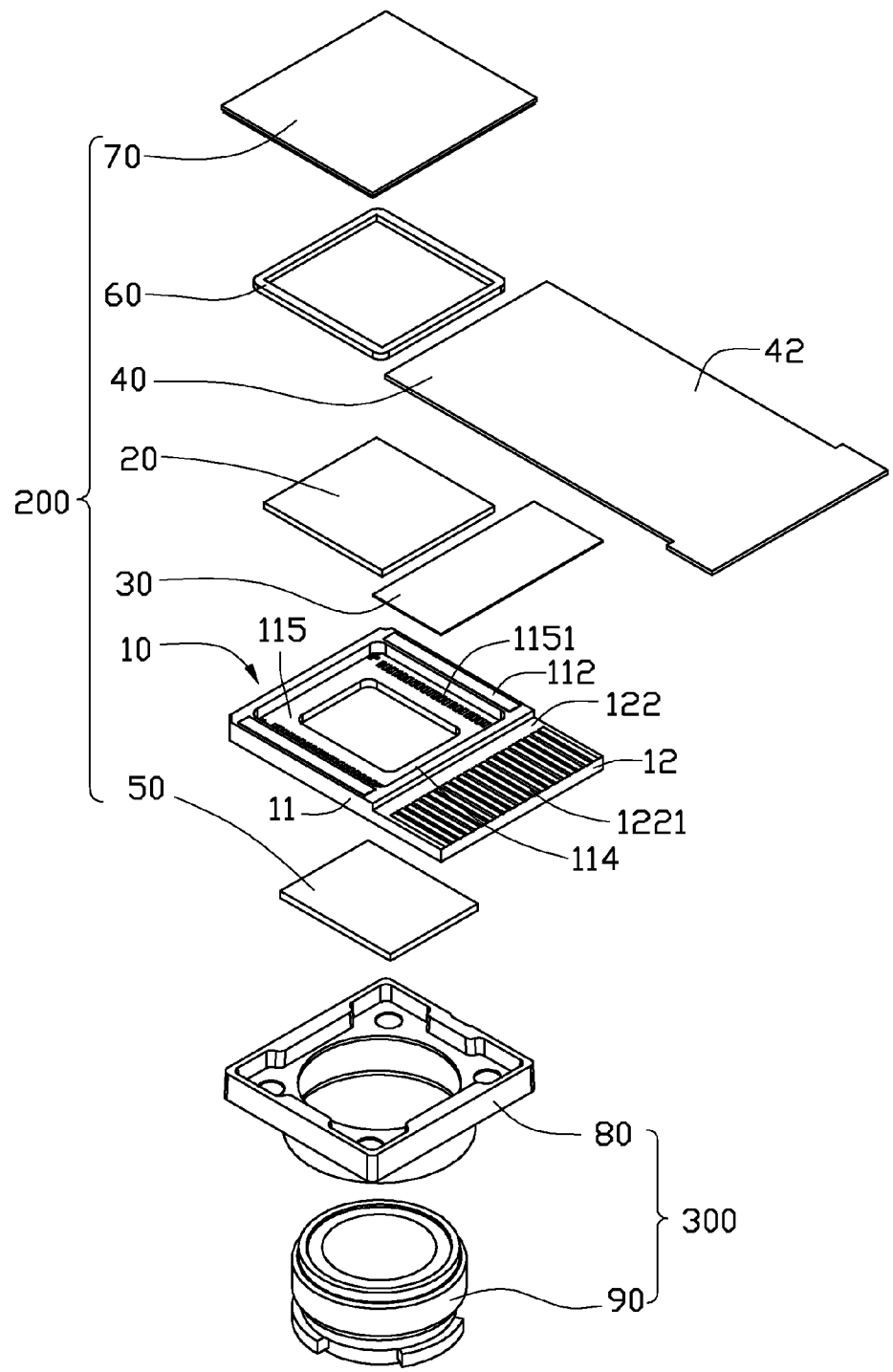
FIG. 3 is similar to FIG. 2, but viewed from another angle.

FIGS. 1-3 show a camera module 100 according to an exemplary embodiment. The camera module 100 includes an image sensor module 200 and a lens module 300 positioned on the image sensor module 200. The image sensor module 200 includes a substrate 10, an image sensor 20, a conductive film 30, a connecting plate 40, a filter 50, a filling body 60, and a bottom plate 70. The lens module 300 includes a lens holder 80, and a lens unit 90.

The substrate 10 is rectangular, and is a printed circuit board. The substrate 10 includes a supporting portion 11 and an extending portion 12 extended from one side of the supporting portion 11.

The supporting portion 11 includes an upper surface 111 and a lower surface 112 opposite to the upper surface 111. The supporting portion 11 defines a through hole 113 penetrating the upper surface 111 and the lower surface 112. The supporting portion 11 defines a receiving recess 114 on the lower surface 112. The receiving recess 114 communicates with the through hole 113. The cross-sectional area of the receiving recess 114 is greater than that of the through hole 113. A step surface 115 facing the lower surface 112 is formed between the receiving recess 114 and the through hole 113. A number of connecting pads 1151 are positioned on the step surface 115, generally adjacent to two sides of the step surface 115.

The extending portion 12 includes a top surface 121 and a bottom surface 122 opposite to the top surface 121. The thickness of the extending portion 12 is less than the thickness of the supporting portion 11. The top surface 121 is coplanar with the upper surface 112. A number of first pads 1221 are positioned on the bottom surface 122. The first pads 1221 are electrically connected to the connecting pads 1151 via wires buried in the substrate 10.

The image sensor 20 includes an image surface 21 and a number of pins 22 adjacent to two opposite edges of the image surface 21. The image sensor 20 is configured for converting light rays projected on the image surface 21 to image signals in form of electric signals, and the image signals are output from the pins 22. In the embodiment, the image sensor 20 can be a complementary metal-oxide-semiconductor transistor (CMOS) sensor or a charge coupled device (CCD) sensor.

The conductive film 30 is an anisotropic conductive film, and is made of resin and conducting particles. In this embodiment, the shape of the conductive film 30 is corresponded to the shape of the extending portion 12. The conductive film 30 is electrically connected along a direction perpendicular to the bottom surface 122 and is electrically disconnected along a direction parallel with the bottom surface 122 when the conductive film 30 is hot pressed.

The connecting plate 40 is a printed circuit board (PCB) or a flexible printed circuit board (FPCB). The connecting plate 40 includes a first surface 41 and a second surface 42 opposite to the first surface 41. A number of second pads 411 are positioned on the first surface 41, and generally adjacent to one end of the connecting plate 40. The arrangement manner of the second pads 411 is corresponding to the arrangement manner of the first pads 1221. The total thickness of the connecting plate 40 and the conductive film 30 is less or equal to the thickness difference between the extending portion 12 and the supporting portion 11.

The filter 50 is rectangular, and is made of transparent materials, such as glass. The filter 50 is configured for filtering infrared light out from the light projected thereon.

The filling body 60 is a frame, and is made of opaque glue. The opaque glue is applied into to a mold and then is cured.

The bottom plate 70 is rectangular, is made of conducting material. The shape of the bottom plate 70 is corresponding to the shape of the supporting portion 11. The bottom plate 70 is used as a grounded point of the image sensor module 200.

Figure 4:
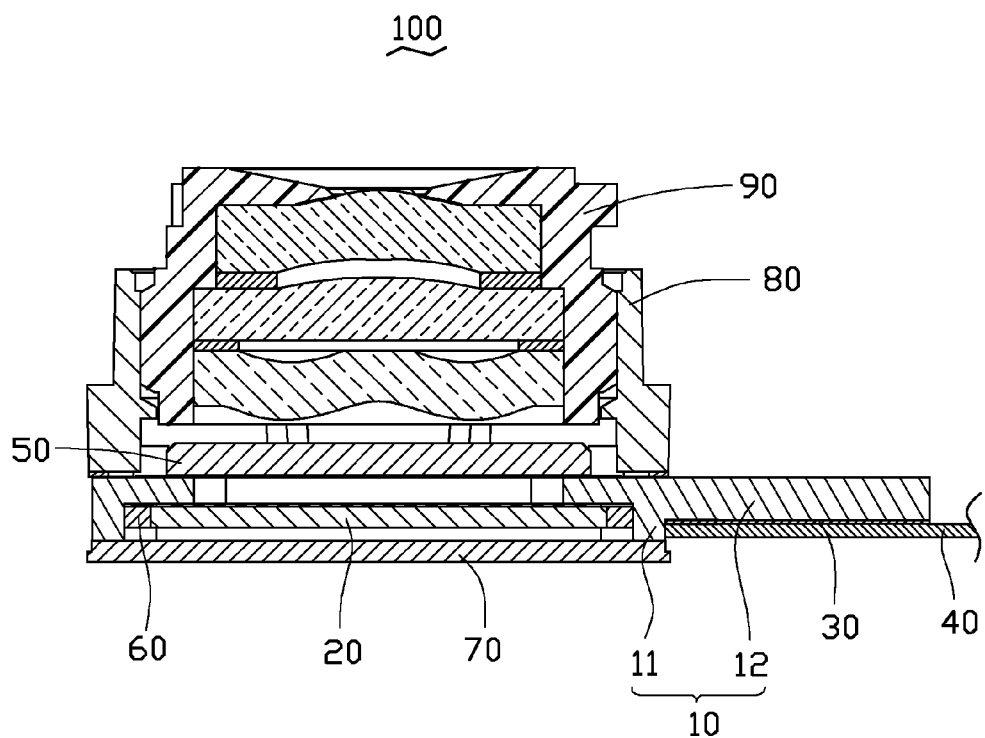
FIG. 4 is a cross-sectional view taken along a line IV-IV of FIG. 1.

Referring to FIG. 4, in assembling of the image sensor module 200, the image sensor 20 is received in the receiving recess 114 of the supporting portion 11, and the image surface 21 faces the through hole 113. The pins 22 are electrically connected to the connecting pads 1151. The filling body 60 is received in the receiving recess 114, and surrounds the image sensor 20. In the embodiment, the opaque glue is applied into the receiving recess 114 and surrounds the image sensor 20. The filling body 60 is formed after the opaque glue is cured. The bottom plate 70 is positioned on the lower surface 112 of the supporting portion 11, and the image sensor 20 is received between the bottom plate 70 and the supporting portion 11. The bottom plate 70 is electrically connected to the supporting portion 11 and serves as ground. The filter 50 is positioned on the upper surface 111 of the supporting portion 11, and the through hole 113 is closed by the filter 50.

At last, the conductive film 30 is adhered on the bottom surface 122 of the extending portion, and then one end of the connecting plate 40 is placed on the conductive film 30. The first pads 1221 are corresponding to the second pads 411. A pressing device (not shown) presses the connecting plate 40, the first pads 1221 are electrically connected to the second pads 411 along a direction perpendicular to the bottom surface 122 via the conductive film 30. In the embodiment, after the image sensor module 200 is assembled, the second surface 42 of the connecting plate 40 is coplanar with the lower surface 112 of the supporting portion 11.

The lens holder 80 includes a seat 81 and a receiving portion 82 positioned on one end of the seat 81. The seat 81 is hollow shaped. The receiving portion 82 defines a lens hole 821 communicating with the seat 81. The lens unit 90 is received in the lens hole 821, and includes at least one lens (not shown) and a barrel receiving the at least one lens.

In assembling the camera module 100, the lens holder 80 receiving the lens unit 90 is positioned on the upper surface 111 of the supporting portion 11. The seat 81 surrounds the through hole 113. The filter 50 is received in the seat 81. The optical axis of the lens unit 90 is collinear with the optical axis of the image sensor 20.

In use, the image sensor 20 converts the light rays penetrating the lens module 300 to the image signals. The image signals are output to the connecting plate 40 orderly through the pins 22, the connecting pads 1151, the first pads 1221, and the second pads 411. As the connecting plate 40 is positioned on the bottom surface 122 of the extending portion 12, and the total thickness of the connecting plate 40 and the conductive film 30 is less or equal to the thickness difference between the extending portion 12 and the supporting portion 11, the height of the camera module 100 is reduced.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An image sensor module, comprising:
   a substrate comprising a supporting portion and an extending portion extending from one side of the supporting portion, the supporting portion comprising an upper surface and a lower surface opposite to the upper surface; the supporting portion defining a through hole penetrating the upper surface and the lower surface and a receiving recess communicating with the through hole on the lower surface; a thickness of the extending portion being less than a thickness of the supporting portion; the extending portion comprising a top surface and a bottom surface, the top surface being coplanar with the upper surface;
   an image sensor received in the receiving recess and electrically connected to the substrate;
   a connecting plate electrically connected to the bottom surface of the extending portion, a thickness of the connecting plate being less than or equal to the thickness difference between the extending portion and the supporting portion; and
   a conductive film adhered between the extending portion and the connecting plate.

2. The image sensor module of claim 1, wherein the total thickness of the connecting plate and the conductive film is less than or equal to the thickness difference between the extending portion and the supporting portion.

3. The image sensor module of claim 1, wherein a cross-sectional area of the receiving recess is greater than a cross-sectional area of the through hole, whereby the supporting portion comprises a step surface between the receiving recess and the through hole; the step surface faces the lower surface; the supporting portion comprises a plurality of connecting pads positioned on the step surface.

4. The image sensor module of claim 3, wherein the image sensor comprises an image surface and a plurality of pins, the image surface faces the through hole, the pins are electrically connected to the connecting pads.

5. The image sensor module of claim 3, wherein the extending portion comprises a plurality of first pads positioned on the bottom surface, and the first pads are electrically connected to the connecting pads.

6. The image sensor module of claim 5, wherein the connecting plate comprises a plurality of second pads positioned on a side thereof, the second pads are corresponding to the first pads, and the first pads are electrically connected to the second pads.

7. A camera module, comprising:
   an image sensor module, comprising:
      a substrate comprising a supporting portion and an extending portion extending from one side of the supporting portion, the supporting portion comprising an upper surface and a lower surface opposite to the upper surface; the supporting portion defining a through hole penetrating the upper surface and the lower surface and a receiving recess communicating with the through hole on the lower surface; a thickness of the extending portion being less than a thickness of the supporting portion; the extending portion comprising a top surface and a bottom surface, the top surface being coplanar with the upper surface;
      an image sensor received in the receiving recess and electrically connected to the substrate;
      a connecting plate electrically connected to the bottom surface of the extending portion, a thickness of the connecting plate being less than or equal to the thickness difference between the extending portion and the supporting portion; and
      a conductive film adhered between the extending portion and the connecting plate; and
   a lens module, comprising:
      a lens holder positioned on the upper surface of the substrate; and
      a lens unit receiving the lens holder.

8. The camera module of claim 7, wherein the total thickness of the connecting plate and the conductive film is less than or equal to the thickness difference between the extending portion and the supporting portion.

9. The camera module of claim 7, wherein a cross-sectional area of the receiving recess is greater than a cross-sectional area of the through hole, whereby the supporting portion comprises a step surface between the receiving recess and the through hole; the step surface faces the lower surface; the supporting portion comprises a plurality of connecting pads positioned on the step surface.

10. The camera module of claim 9, wherein the image sensor comprises an image surface and a plurality of pins, the image surface faces the through hole, the pins are electrically connected to the connecting pads.

11. The camera module of claim 9, wherein the extending portion comprises a plurality of first pads positioned on the bottom surface, and the first pads are electrically connected to the connecting pads.

12. The camera module of claim 11, wherein the connecting plate comprises a plurality of second pads positioned on a side thereof, the second pads are corresponding to the first pads, and the first pads are electrically connected to the second pads.

* * * * *